US006748177B1

(12) United States Patent  
Upton

(10) Patent No.: US 6,748,177 B1
(45) Date of Patent: Jun. 8, 2004

(54) MULTIPLE DEGREE OF FREEDOM BIMORPH POSITIONER AND CONTROLLER

(75) Inventor: Eric L. Upton, Bellevue, WA (US)

(73) Assignee: Terabeam Corporation, Redmond, WA (US)

( * ) Notice: Subject to any disclaimer, the term of this patent is extended or adjusted under 35 U.S.C. 154(b) by 623 days.

(21) Appl. No.: 09/849,179

(22) Filed: May 4, 2001

(51) Int. Cl.[7] .............................................. H04B 10/00
(52) U.S. Cl. ........................ 398/129; 398/131; 398/135; 310/311
(58) Field of Search ................................. 398/129, 131, 398/122, 118, 139, 164; 310/311; 174/50, 61

(56) References Cited

U.S. PATENT DOCUMENTS

2002/0131123 A1 * 9/2002 Clark ........................... 359/154

* cited by examiner

*Primary Examiner*—Kinfe-Michael Negash
(74) *Attorney, Agent, or Firm*—Blakely, Sokoloff, Taylor & Zafman, LLP

(57) ABSTRACT

An apparatus for positioning an end effector and associated position controller. The apparatus comprises a plurality of bimorph members, generally elongated in shape, that are coupled end-to-end. In one embodiment, each bimorph member includes a pair of elongated piezoelectric bimorph elements that cause a localized deformation in the bimorph member when driven with an input voltage. Accordingly, each bimorph member can be caused to bend in opposite directions, as well as twist, depending on its drive voltages. In one configuration, four bimorph members are connected end-to-end, with the last bimorph member operatively coupled to the end effector, providing a five-degree of freedom positioner. A multi-channel position controller that provides a pair of correlative feedback loops for each channel is used to generate appropriate drive voltages based on a global feedback signal and a local feedback signal corresponding to a measured position of each channel's corresponding piezoelectric bimorph element.

22 Claims, 13 Drawing Sheets

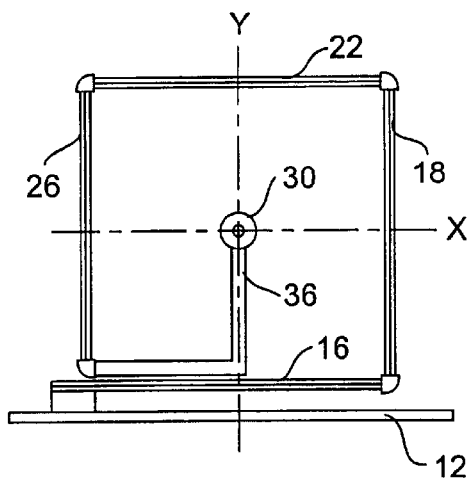
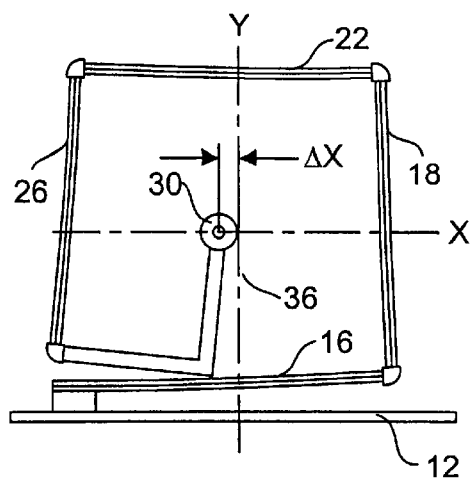
FIG. 6A  FIG. 6B
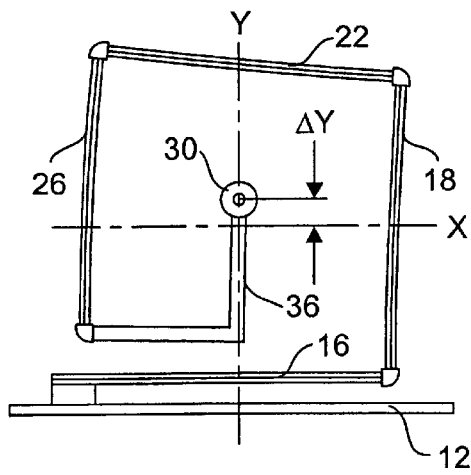
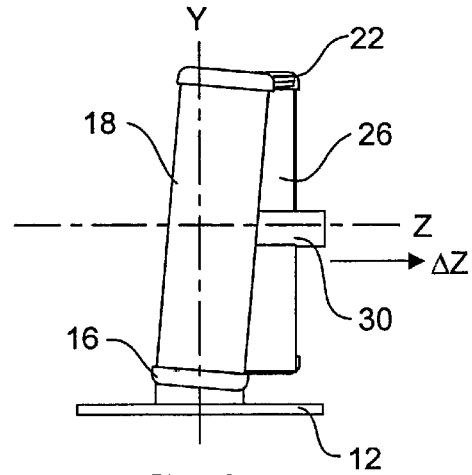
FIG. 6C  FIG. 6D
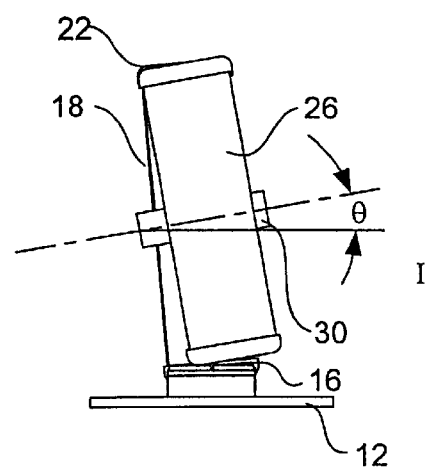
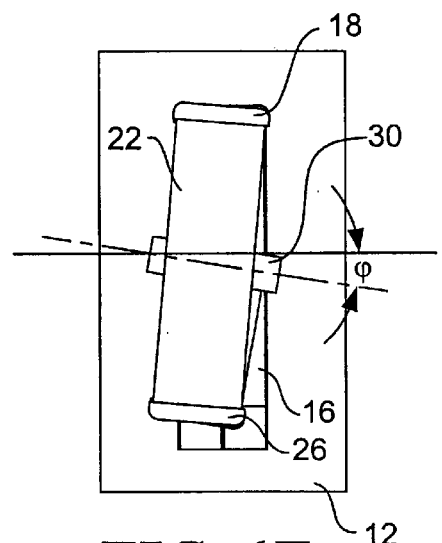
FIG. 6E  FIG. 6F

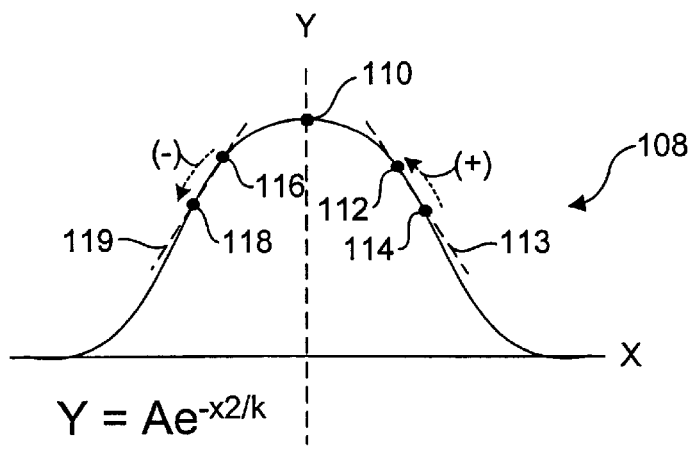
FIG. 11
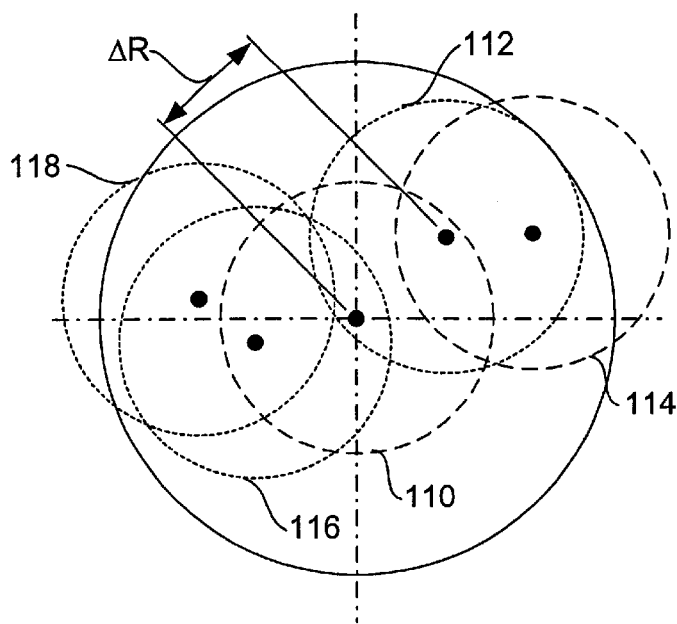
FIG. 12
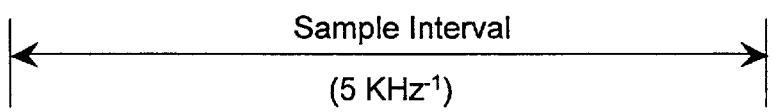
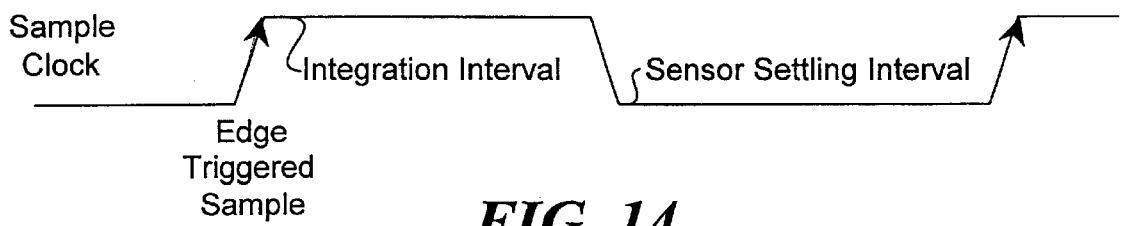
FIG. 14

MULTIPLE DEGREE OF FREEDOM BIMORPH POSITIONER AND CONTROLLER

BACKGROUND OF THE INVENTION

1. Field of the Invention

The present invention relates generally to positioning devices, and, more specifically, to an apparatus for positioning an end effector about multiple degrees of freedom. The apparatus and associated controller is especially suited for positioning an end portion of a fiber optic cable when used in a free-space optical communications system.

2. Background Information

With the increasing popularity of wide area networks (WANs), such as the Internet and/or the World Wide Web, network growth and traffic has exploded in recent years. Network users continue to demand faster networks and more access for both businesses and consumers. As network demands continue to increase, existing network infrastructures and technologies are reaching their limits.

An alternative to present day hardwired or fiber network solutions is the use of wireless optical communications. Wireless optical communications utilize point-to-point communications through free-space and therefore do not require the routing of cables or fibers between locations. Thus, wireless optical communications are also known as free-space or atmospheric optical communications. For instance, in a free-space optical communication system, a beam of light is directed through free-space from a transmitter at a first location to a receiver at a second location. Data or information is encoded into the beam of light, and therefore, the information is transmitted through free-space from the first location to the second location.

An important aspect of a free-space optical communications system is tracking. In particular, it is important that the optical communications beam (e.g., laser beam) is aimed properly from the transmitter at the first location and that the receiver at the second location is aligned properly to receive the optical communications beam. For example, assume that a transmitter is mounted on a first building and that a receiver is mounted on a different second building. Assume further that there is a line of sight between the transmitter and receiver. It is important for the transmitter on the first building to be configured to accurately direct or aim the optical communications beam at the receiver on the second building.

Tracking is utilized for maintaining the alignment of the optical communications beam between the transmitter and receiver in various situations or disturbances. Examples of these various situations or disturbances include the swaying of the buildings due to for example windy conditions, vibration of the platforms on which the transmitter and/or receiver are mounted, atmosphere-induced beam steering, etc. If the tracking system is unable to compensate for disturbances, the optical communications beam is no longer properly aimed at the receiver and, consequently, communications between the transmitter and receiver are lost or impaired.

SUMMARY OF THE INVENTION

The present invention provides an apparatus for positioning an end effector and components attached thereto and an associated multi-channel position controller. The positioner apparatus comprises a plurality of bimorph members, generally elongated in shape, that are coupled end-to-end. For example, in one embodiment, four bimorph members are coupled end-to-end, wherein each adjacent pair of bimorph members are substantially orthogonal. Each bimorph member includes a pair of elongated piezoelectric bimorph elements that cause a localized deformation in the bimorph member when driven with an input voltage. Accordingly, each bimorph member can be caused to bend inwardly or outwardly, as well as twist, depending on its drive voltages. In one configuration, four substantially orthogonal bimorph members are connected end-to-end, with the last bimorph member operatively coupled to the end effector. By controlling the drive voltages to each of the piezoelectric bimorph elements, the end effector may be moved about five degrees of freedom, including displacement along orthogonal X, Y and Z axes, and rotations about elevation and azimuth axes.

The multi-channel position controller implements a pair of correlative feedback loops for each channel, including a global feedback signal that is shared by all channels and a local feedback signal corresponding to each individual channel. In one embodiment, the multi-channel position controller is implemented in a free-space optical communications system, wherein the global feedback corresponds to a signal strength measurement of a transmitted signal, and the local feedback signal comprise a position sense signal that is produced by each piezoelectric bimorph element. The positioner is correlative in the sense that it uses both feedback signals to correlate which direction the drive voltage input for a given channel needs to change.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 4A–C illustrate various positions of a cantilever mounted bimorph member that includes two elongated piezoelectric bimorph elements, wherein: FIG. 4A shows the bimorph member in a nominal position; FIG. 4B shows the bimorph member in a bent configuration that is produced by applying similar drive voltages to the piezoelectric bimorph elements; and FIG. 4C shows the bimorph member in a twisted configuration that is produced by applying different drive voltages to the piezoelectric bimorph elements;

FIGS. 6A–6F illustrate various positions of the bimorph positioner when its end effector is moved, wherein: FIG. 6A illustrates a nominal condition; FIG. 6B illustrates a displacement along the X axis, FIG. 6C illustrates a displacement along the Y axis; FIG. 6D illustrates a displacement along the Z axis; FIG. 6E illustrates a rotation in an elevation axis $\theta$; and FIG. 6F illustrates a rotation in an azimuth axis $\phi$;

FIGS. 9A–F illustrate various positions of the bimorph positioner when its end effector is moved, and the effect caused to an collimated optical beam used in the free-space optical communications system wherein: FIG. 9A illustrates a nominal condition; FIG. 9B illustrates a displacement along the X axis, FIG. 9C illustrates a displacement along the Y axis; FIG. 9D illustrates a displacement along the Z axis; FIG. 9E illustrates a rotation in elevation axis θ; and FIG. 9F illustrates a rotation in azimuth axis φ;

FIG. 11 is a graph illustrating the change in signal strength vs. a change in the collimated beam relative to a maximized position as measured by a detector used in the free-space optical communications system;

FIG. 12 depicts the positions of the center of various collimated beams for assisting in explaining the signal strength graph of FIG. 10;

FIG. 14 is a timing diagram corresponding to the alternate drive voltage input and sensor measurement of the piezoelectric bimorph elements used in the bimorph members of the positioner when controlled by the processing circuit of FIG. 13;

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

In one example embodiment of the present invention, point-to-point free-space optical communications are provided from a transmitter to a receiver. The transmitter and receiver may be located at the same location or at different locations such as on different buildings within a line of sight of each other. In one embodiment, the line of sight may include reflections off one or more reflective surfaces between the transmitter and receiver in accordance with the teachings of the present invention. It is appreciated that the transmitter and the receiver may be parts of transceivers, or transmitter-receiver combinations, at their respective locations, such that bi-directional communications are provided. In the example embodiment, the transmitter includes an optical source that generates an optical communications beam, such as a laser beam or the like, on which data or information is modulated. The optical communications beam is not limited to being monochromatic or to any particular wavelength or color and may include the visible light as well as ultra violet or infra-red portions of the spectrum.

Figure 15A:
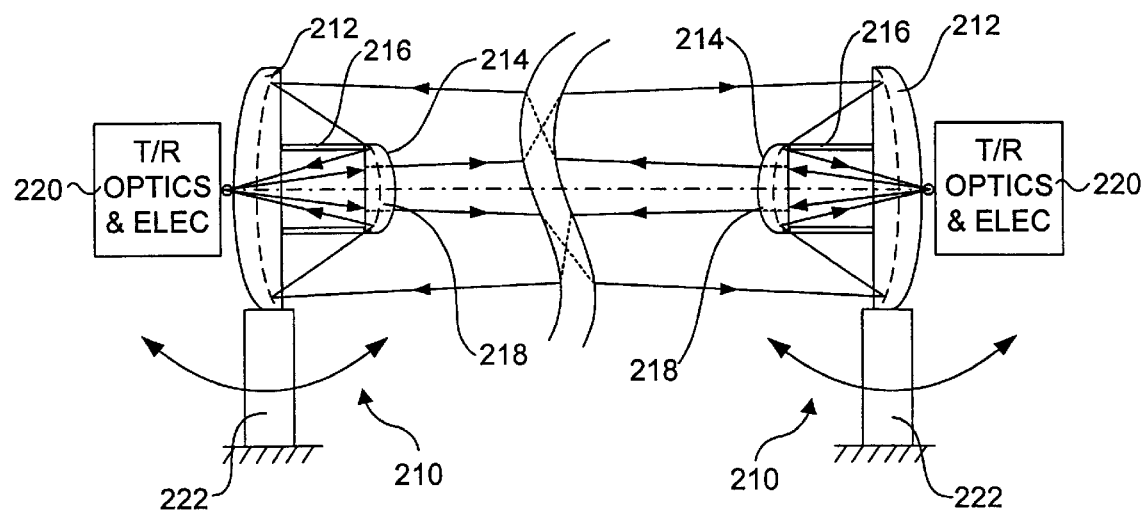
FIG. 15A is an illustration of a convention optical communications system that uses on-axis primary and secondary reflectors and provides transmitting and receiving capabilities at a pair of transceiver stations disposed at remote locations.
Figure 15B:
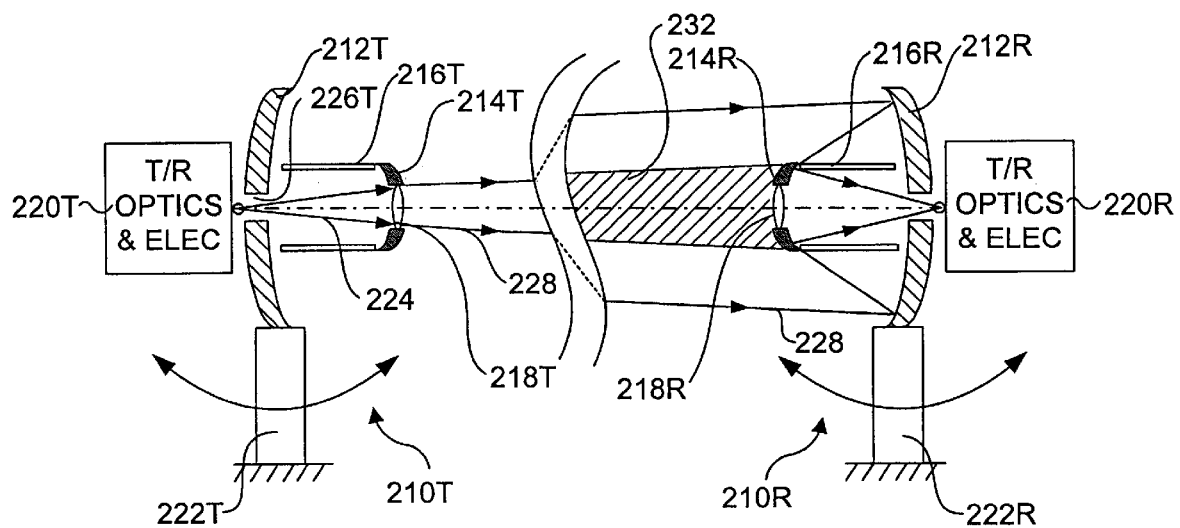
FIG. 15B shows how an optical signal is transmitted by a first transceiver station and received by a second transceiver station.

A conventional free-space optical system is shown in FIGS. 15A and 15B. The free-space optical system includes a pair of transceiver stations 210 that are typically located on or in separate buildings or towers. Each transceiver station 210 includes a primary collector 212 to which a secondary mirror 214 is coupled via a plurality of rigid struts 216. The transceiver stations further include a transmitted signal lens 218 mounted within secondary mirror 214, and a set of transmitter/receiver optics and electronics 220. All of components 212, 214, 216, 218, and 220 are operatively coupled to a yoke that is connected to a base 222 via a gimble assembly, such that these components are all moved in response to a gimbled movement of the yoke relative to a static surface on which the base 222 is placed.

With reference to FIG. 15B, data is transmitted from a transceiver station 210T to a transceiver station 210R in the following manner. An optical signal 224 is generated by transmitter/receiver optics and electronics 220T of transceiver station 210T and directed through an opening 226T defined in primary collector 212T towards transmitted signal lens 218T, which produces a collimated signal 228. As collimated signal 228 moves toward transceiver station 210R, the width of the signal diverges very gradually. As will be recognized by those skilled in the art, the divergence of the various optical signals depicted in the Figures contained herein are exaggerated for clarity. Upon reaching transceiver station 210R, the outer portions of collimated signal 228 impinge upon primary collector 212R, which comprises a concave mirrored surface that redirects those portions of the signal that impinge upon it toward secondary mirror 214R. Collimated signal 228 is then reflected by secondary mirror 214R towards the secondary mirror's focal point 230, where it is received by transmitter/receiver optics and electronics 220R.

One disadvantage of this configuration is that the entire optical assembly (i.e., components, 212, 214, 216, 218, and 220) must be rotated by gimbled base 222 to account for environmental disturbances such as building sway. As a result, the available positional bandwidth (i.e., the maximum frequency at which positions can be changed) when using a gimbled mechanism of the type typically employed for such stations is limited by physical considerations, such as inertia, mechanical vibrations, servo motor constraints, friction, etc. In additional, the devices for receiving and sending optical signals are very complex and expensive manufacture.

The present invention addresses many limitations found in conventional free-space optical communication systems by providing a positioning mechanism that enables optical beams to be directed and tracked with a high accuracy and response. The mechanism is small and lightweight, comprising components with very low inertias and high frequency response. As a result, the tracking bandwidth provided by the system is much higher than that found in the conventional art.

Figure 1:
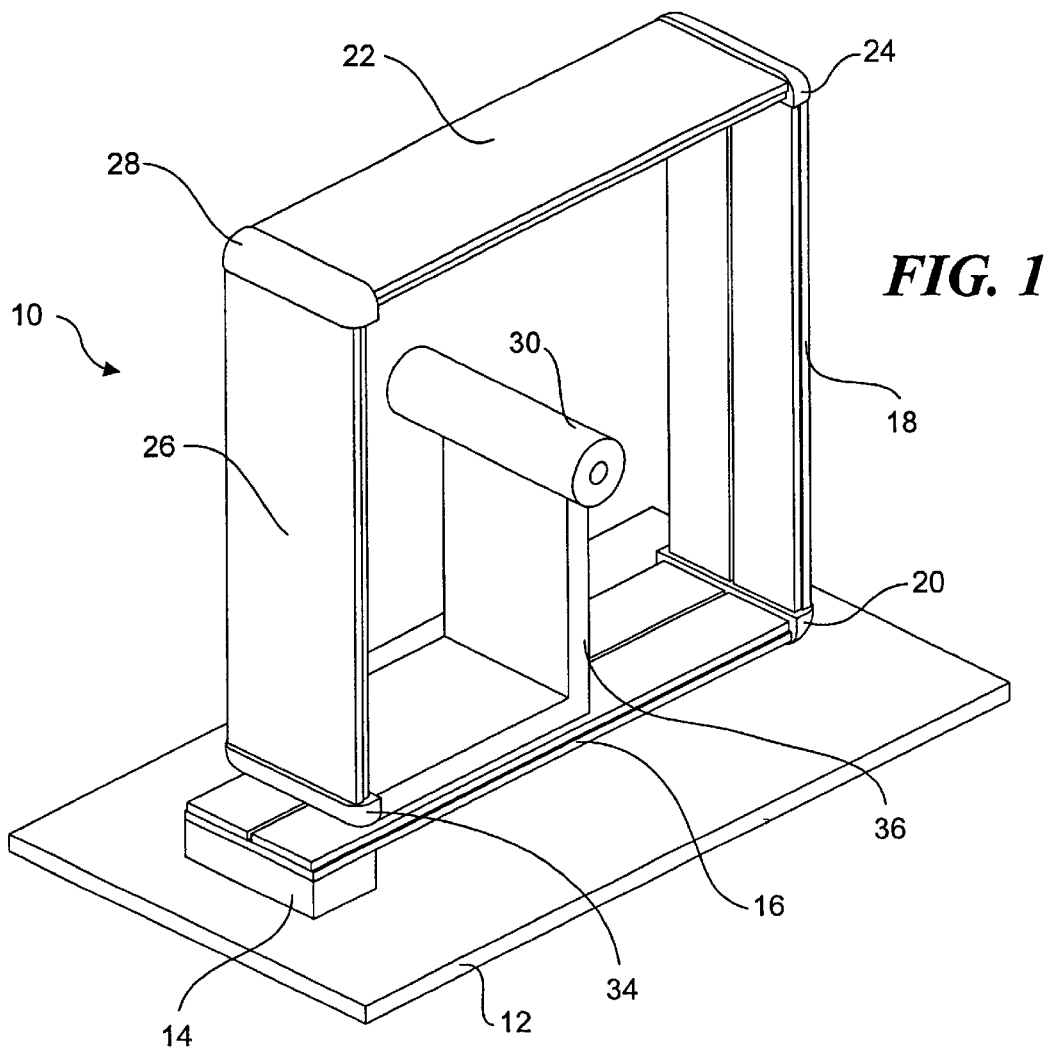
FIG. 1 illustrates an exemplary multi-axis bimorph positioner in accord with the present invention.

An exemplary 5-degree of freedom bimorph positioner 10 in accordance with the invention is shown in FIG. 1. Bimorph positioner 10 includes a base 12 to which a support 14 is mounted. Collectively, base 12 and support 14 comprise a primary support member. A base bimorph member 16 is cantilever mounted to support 14 at one end, and coupled to a first vertical bimorph member 18 at its free end, via a substantially rigid coupling 20. In a similar manner, first vertical bimorph member 18 is coupled to a horizontal bimorph member 22 via a coupling 24, while a free end of horizontal bimorph member 22 is coupled to a second vertical bimorph member 26 via a coupling 28. A free end of second vertical bimorph member 26 is operatively coupled to an end effector 30 by means of a coupling 34 and an L-support 36.

Figure 2:
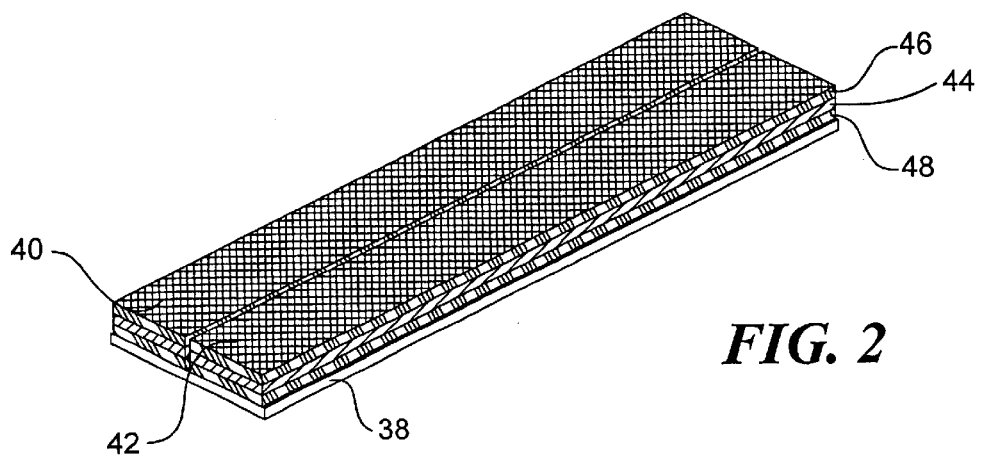
FIG. 2 illustrates the construction of one embodiment of the bimorph members used in the bimorph positioner of FIG. 1.

As shown in FIG. 2, in one embodiment, each of bimorph members 16, 18, 22 and 26 comprise a flexible substrate 38 on which a pair of piezoelectric bimorph elements 40 and 42 are mounted. Each piezoelectric bimorph element 40, 42 comprises a multiplayer sandwich comprising alternating layers of metal and a piezoelectric material. For example, as depicted in FIG. 2, each piezoelectric bimorph element 40, 42 comprise a single piezoelectric layer 44 sandwiched by two metal layers 46 and 48.

Figure 3:
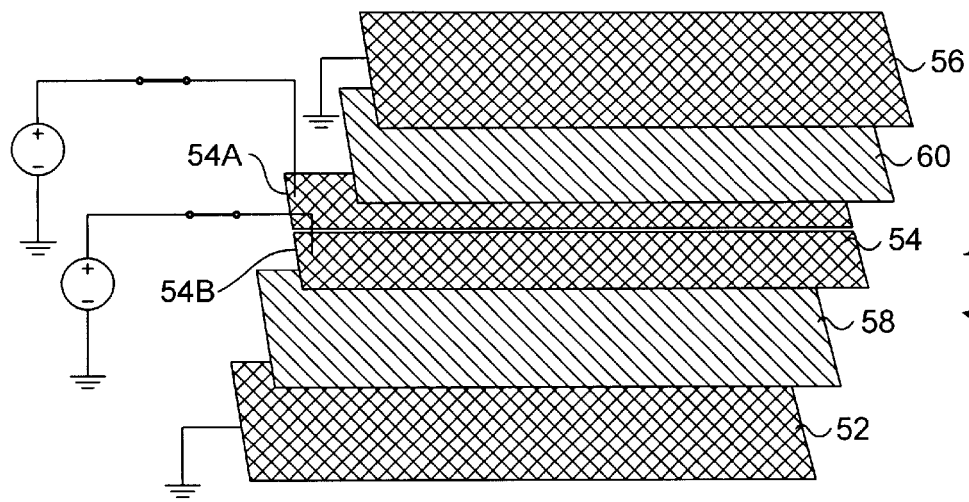
FIG. 3 illustrates the construction of a second embodiment of the bimorph members used in the bimorph positioner of FIG. 1.

An optional configuration 50 for the piezoelectric bimorph elements is shown in FIG. 3. In configuration 50, each of bimorph members 16, 18, 22, and 26 comprise a five-layer sandwich including three metal layers 52, 54, and 56, which are alternated with two piezoelectric layers 58 and 60. In addition, the middle metallic layer 54 is split lengthwise into two portions 54A and 54B.

Piezoelectric materials have a particular crystalline molecular structure that enables components manufactured from such materials to expand or contract when a voltage differential is applied across appropriate input points on those components. Typically, the direction of the expansion and contraction can be controlled using appropriate manufacturing techniques. For example, piezoelectric elements having elongated configurations that expand or contract in the direction of their elongated axis are manufactured by several vendors. In general, the amount of extension or contraction is a linear function of the length of the element, and the difference in the voltages applied to the opposing metal layers (i.e., the drive voltage). For instance, piezoelectric materials may be characterized by an expansion coefficient defined in • m/mV (micrometer/meter/volt).

Figure 4A:
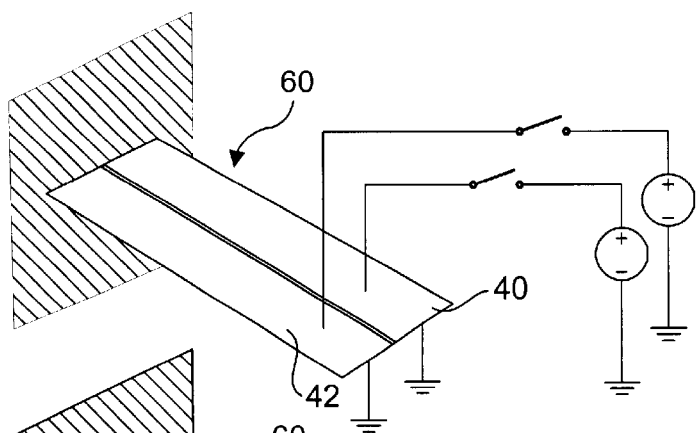
Figure 4B:
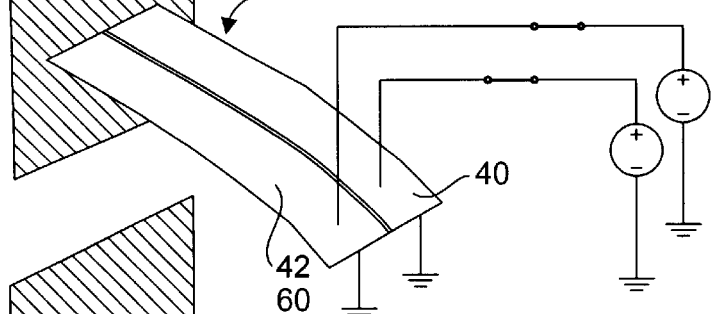
Figure 4C:
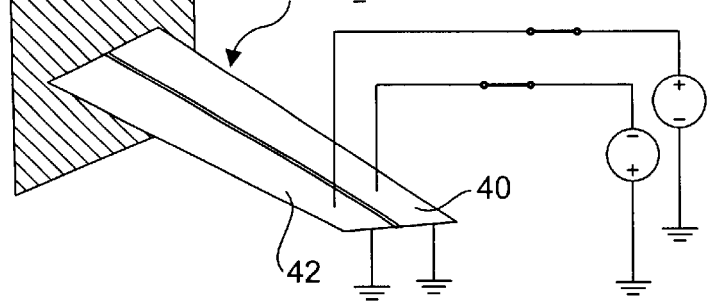

With reference to FIGS. 4A–C, activation of an input drive voltages across opposing faces of piezoelectric bimorph elements 40 and 42 having a substantially elongated rectangular configuration similar to that shown in FIG. 2 causes a cantilever-mounted bimorph member 62 to bend when the same drive voltage is applied to both piezoelectric bimorph elements, and to twist when different drive voltages are applied (e.g., a positive drive voltage on one and a negative drive voltage one the other) to the piezoelectric bimorph elements. In addition to bending downward, as shown in FIG. 4B, a bimorph member may be bent upward by reversing the drive voltages (not shown).

Figure 5:
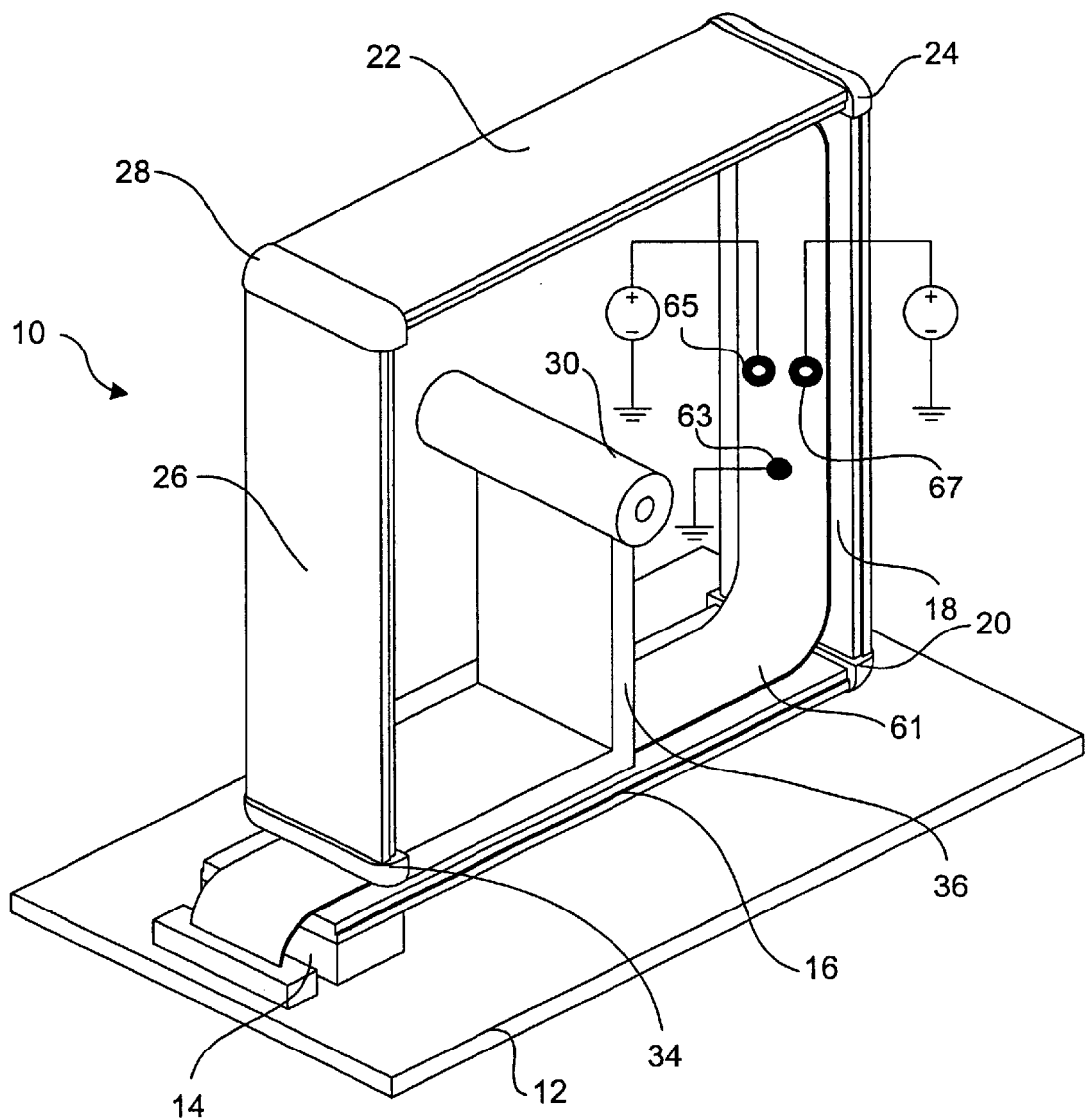
FIG. 5 illustrates a bimorph positioner that implements a flex circuit to provide drive voltages to the bimorph members.

The drive voltages may be applied to appropriate metal components using various well-known wiring techniques, such as individual wires or bundled groups of wires. Where applicable, wiring may be connected to these metal components through direct attachment, or through properly configured vias. For example, as shown in FIG. 5, one technique for supplying drive voltages to bimorph members 16, 18, 22, and 26 is to ground potential one side and provide positive and/or negative drive voltages using a flex circuit 61 that is electrically coupled through direct connection pads 63 and vias 65 and 67 that are built into each bimorph member.

Using appropriate drive voltages, end effector 30 of bimorph positioner 10 can be caused to be displaced about five degrees of freedom, including X, Y, an Z orthogonal displacements, as well as a rotation θ about the X axis, also known as elevation or pitch, and rotation φ about the Y axis, also known a azimuth or yaw. For example, various configurations of bimorph positioner 10 are depicted in FIGS. 6A–F, wherein FIG. 6A shows bimorph positioner 10 in its normal configuration (that is, a configuration in which no drive voltages are applied to bimorph members 16, 18, 22, and 26), and FIGS. 6B–5F illustrate displacements about the X, Y, and Z axes and rotations in θ and φ, respectively. It is noted that all of the positions shown in FIGS. 6B–F are exaggerated for clarity.

In the following description and as depicted in FIGS. 6B–F, it will be assumed that application of a negative drive voltage causes a bimorph member to bend inwardly, while application of a positive drive voltage causes a bimorph element to bend outwardly. Accordingly, displacements of end effector 30 in the XY plane may be effected by applying the same drive voltages (typically a combination of positive and negative drive voltages) to each of the piezoelectric bimorph elements for bimorph members 16, 18, 22, and 26. In contrast, causing a displacement of end effector 30 in the Z direction or rotation of end effector 30 in θ or φ will require different drive voltages to be applied to the piezoelectric bimorph elements of at least one of the bimorph members.

For example, as shown in FIG. 6B, end effector 30 may be displaced by ΔX in the positive X direction by applying a negative drive voltage to both piezoelectric bimorph elements of bimorph member 16, and applying positive drive voltages to both piezoelectric bimorph elements of bimorph members 18, 22, 26. Similarly, end effector 30 may be displaced by ΔY in the positive Y direction by applying a positive drive voltage to both piezoelectric bimorph elements of bimorph members 18, and 22, while applying negative drive voltages to both piezoelectric bimorph elements of bimorph member 26, as illustrated in FIG. 6C.

As shown in FIG. 6D, a displacement ΔZ of end effector 30 in the positive Z direction generally may be obtained by applying differential drive voltages to the piezoelectric bimorph elements of each of bimorph members 16, 18, and 22, wherein bimorph members 16 and 22 are twisted in opposite directions. As shown in FIG. 6E, a rotational displacement of end effector 30 in θ may be obtained by applying differential drive voltages to the piezoelectric bimorph elements of bimorph members 16, 18, 22, and 26, wherein each of the bimorph member are twisted in the same direction. Similarly, a rotational displacement of end effector 30 in φ may be obtained by applying differential drive voltages to the piezoelectric bimorph elements of bimorph members 18, 22, and 26, wherein each of the bimorph members are twisted in the same direction, as illustrated in FIG. 6F.

Figure 7:
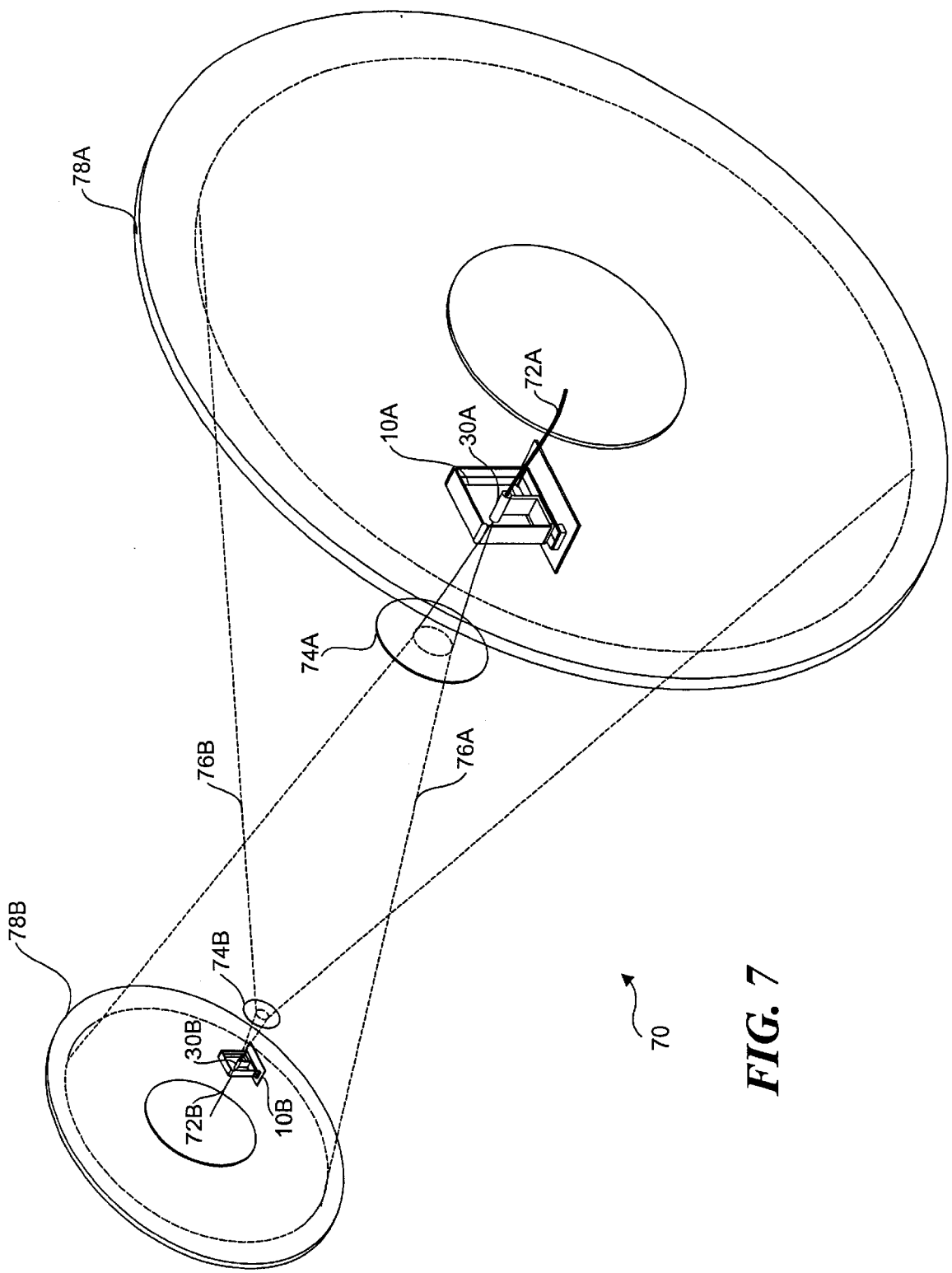
FIG. 7 illustrates an exemplary implementation of the invention in a free-space optical communications system.

Bimorph positioner 10 is designed for precision high-bandwidth positioning of objects connected to end effector 30. Accordingly, bimorph positioner 10 is well suited for use in free-space optical communications systems, such as a communication system 70 shown in FIG. 7. Communications system 70 works as follows. Signals are transmitted from ends of fiber optic cables 72A and 72B toward respective collimated lenses 74A and 74B, thereby creating collimated beams 76A and 76B. Collimated beams 76A and 76B are then directed toward primary reflectors 78B and 78A, respectively, whereupon the beams are reflected off of secondary reflectors and directed toward respective detectors (not shown). The directions of the collimated beams are controlled by bimorph positioners 10A and 10B via positioning of end effectors 30A and 30B, which are respectively coupled to the ends of fiber optic cables 72A and 72B.

Figure 8:
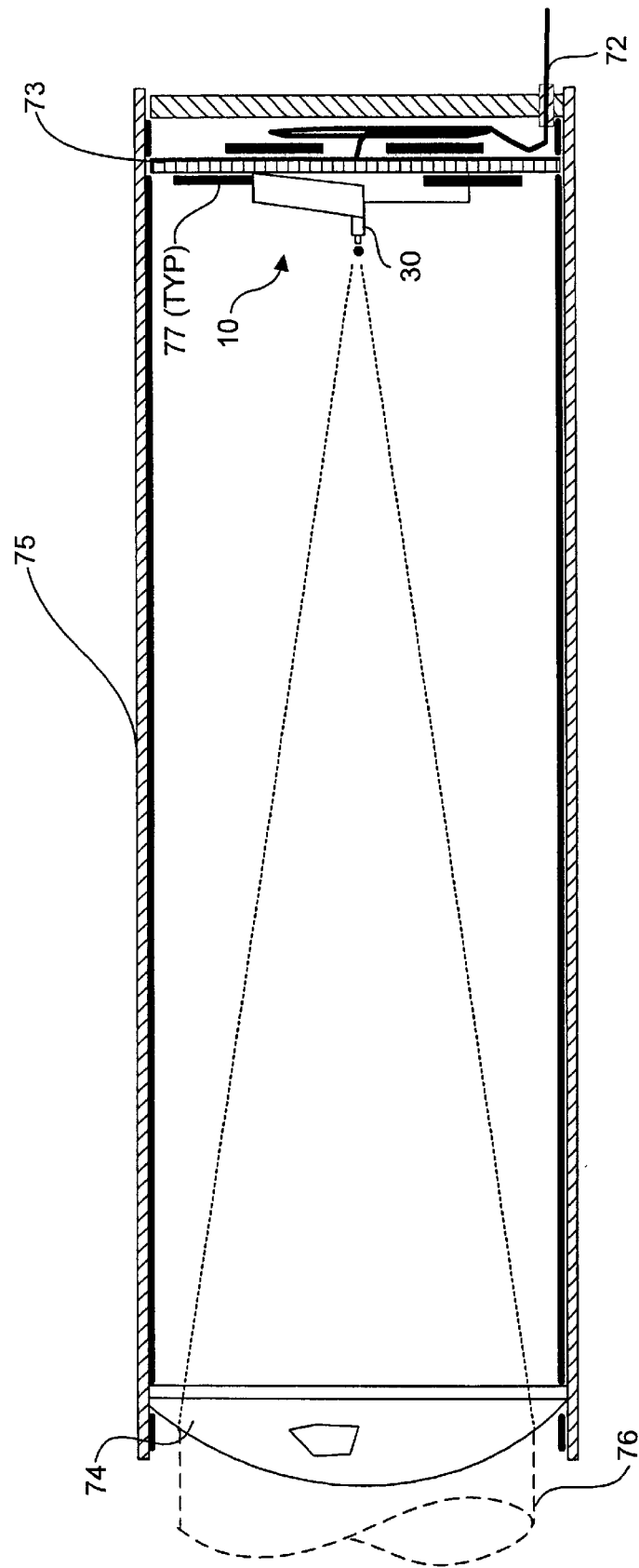
FIG. 8 shows a telescope that includes the bimorph positioner and may be used in the free-space optical communications system.

Details of an exemplary transmitting "telescope" 71 are shown in FIG. 8. Telescope 71 is used to transmit a light beam that is directed toward the primary reflector of a receiving unit. Light is supplied to a fiber optic cable 72, whose end is held by end effector 30 of a bimorph positioner 10 that is mounted on or attached to a printed circuit board 73 that is mounted within a cylindrical shell 75. As described below, a control system is provided that generally may be implemented through a combination of digital and analog circuits, as depicted by integrated circuits 72. Light emitted from the end of fiber optic cable 72 diverges at a slight angle until it passes though a collimating lens 74, whereupon the light is collimated into a collimated beam 76.

Collimated beams 76A and 76B comprise beams of light that are modulated a very high frequencies. Due to safety and other considerations, the amount of power for these light beams is limited. As a result, it is very important that the beams be directed as accurately as possible such that the entire beams or at least a substantial portion thereof falls upon primary reflectors 78A and 78B.

Typically, the foregoing components will be included in a set of transceivers that are displaced by a substantial distance (e.g., 1 kilometer). Furthermore, each transceiver is generally mounted in a building office or on top of a building or similar structure. Due to mechanical disturbances, such as lower frequency vibrations, building sway, deflection of windows caused by wind, etc., collimated beams 76A and 76B are caused to be directed away from their desired targets (i.e., the centers of primary reflectors 78A and 78B. This may potentially lead to data losses, and in the worst case, complete loss of signals.

By controlling the position of end effectors 30 (and thus the ends of fiber optic cables 72A and 72B), bimorph positioners 10A and 10B can be used to maintain communication signals between the pair of transceivers. The effect of changing the position of an end effector 30 is depicted in FIGS. 9A–9F. For simplicity, only a single communication path is shown, and the changes are exaggerated for clarity. Furthermore, it will be appreciated that in practice it will be desired to direct the light beams toward the center of their corresponding targets. In operation, the bases of the bimorph positioners will be caused to move due to the mechanical disturbances. However, for clarity, the base position is constant in all of FIGS. 9A–9F, and the change in where the beams impinge on the primary reflector is shown to illustrate how the position of the beam can be changed by changing the position of the end effector.

Figure 9A:
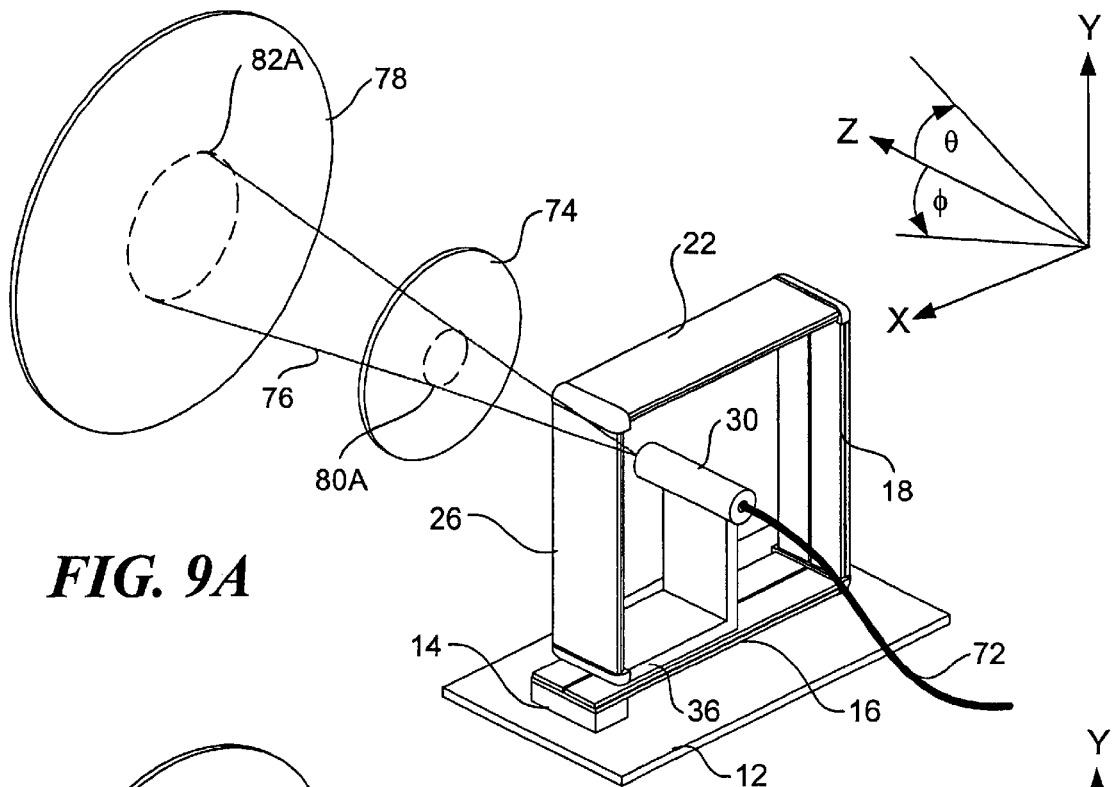

FIG. 9A shows an optimum position in which collimated beam 76 impinges on collimated lens 74 at a circle 80, and impinges on primary reflector 82 at a circle 82 that is approximately centered on the primary reflector. It is noted that in practice, the beam would actually occupy the majority of the primary reflector, if not all of it. However, for illustrative purposes, a much smaller beam is shown in FIGS. 9A–9F.

Figure 9B:
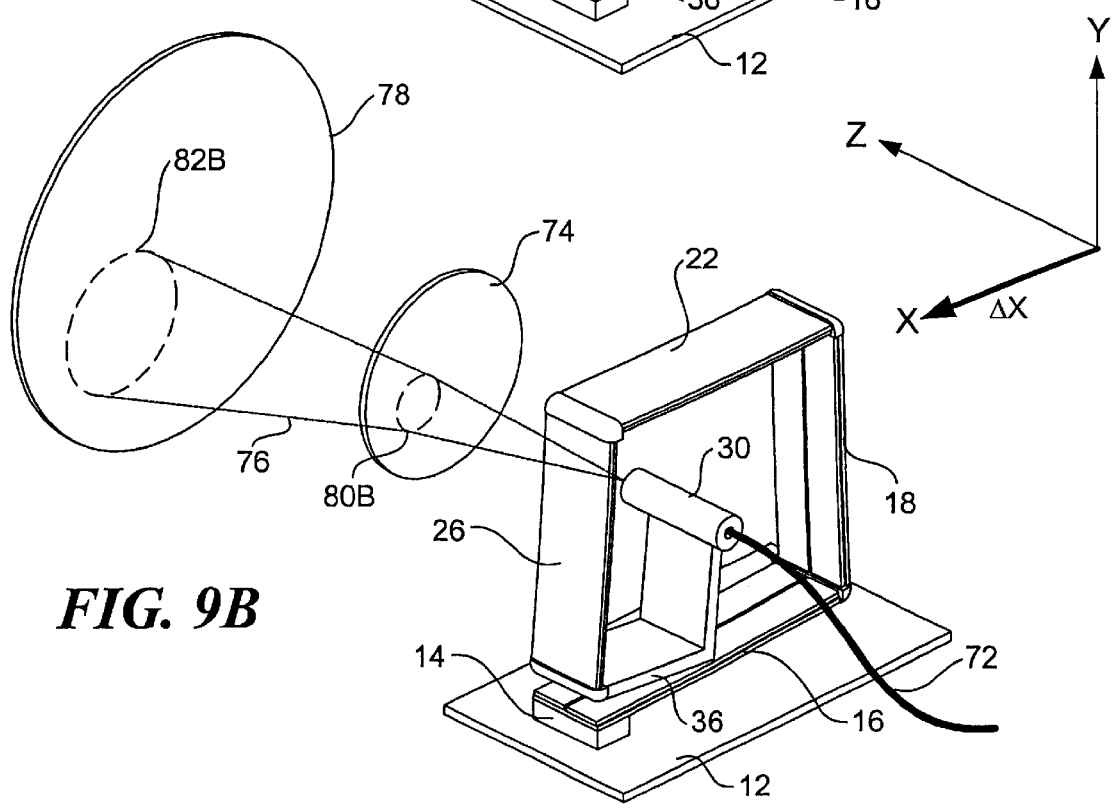
Figure 9C:
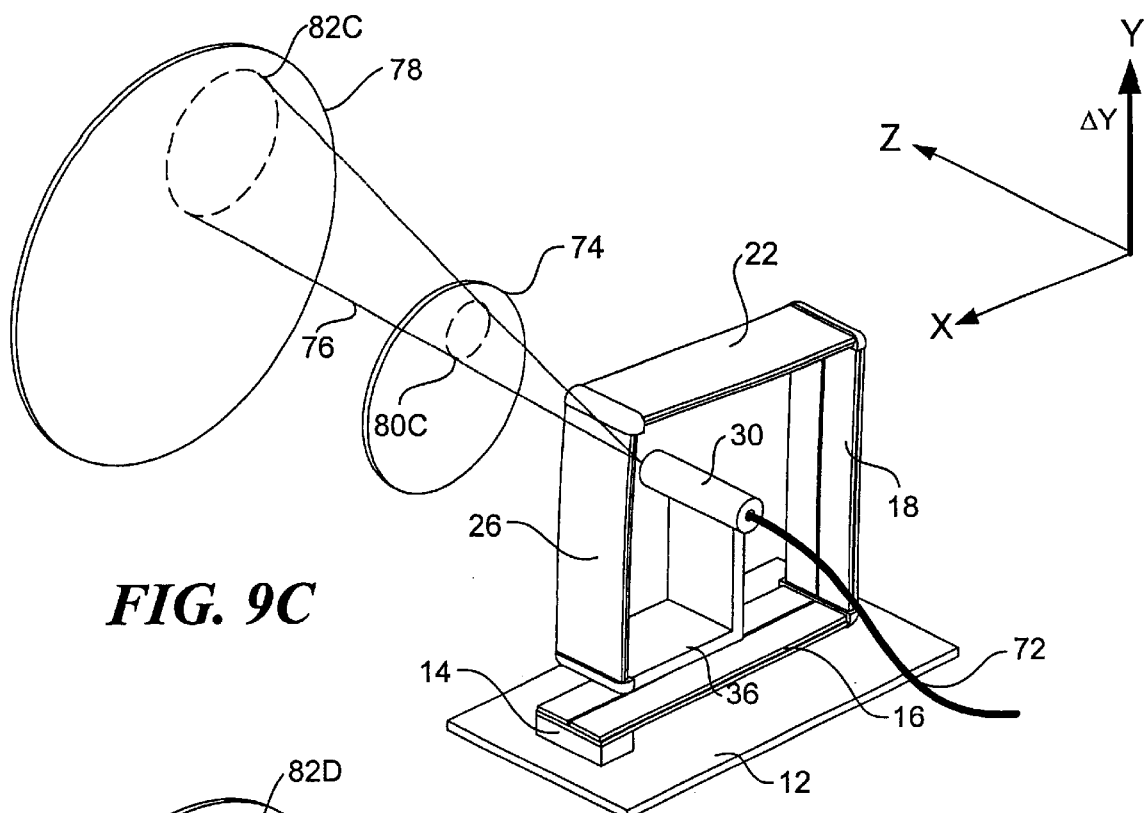

FIG. 9B illustrates the effect of deflecting end positioner 30 by $\Delta X$. This causes the position of the beam to shift to the left, as illustrated by circles 80B and 82B. In FIG. 9C, the position of the end effector is shift upward by $\Delta Y$, causing a corresponding upward shift of the beam, as illustrated by circles 80C and 82C.

Figure 9D:
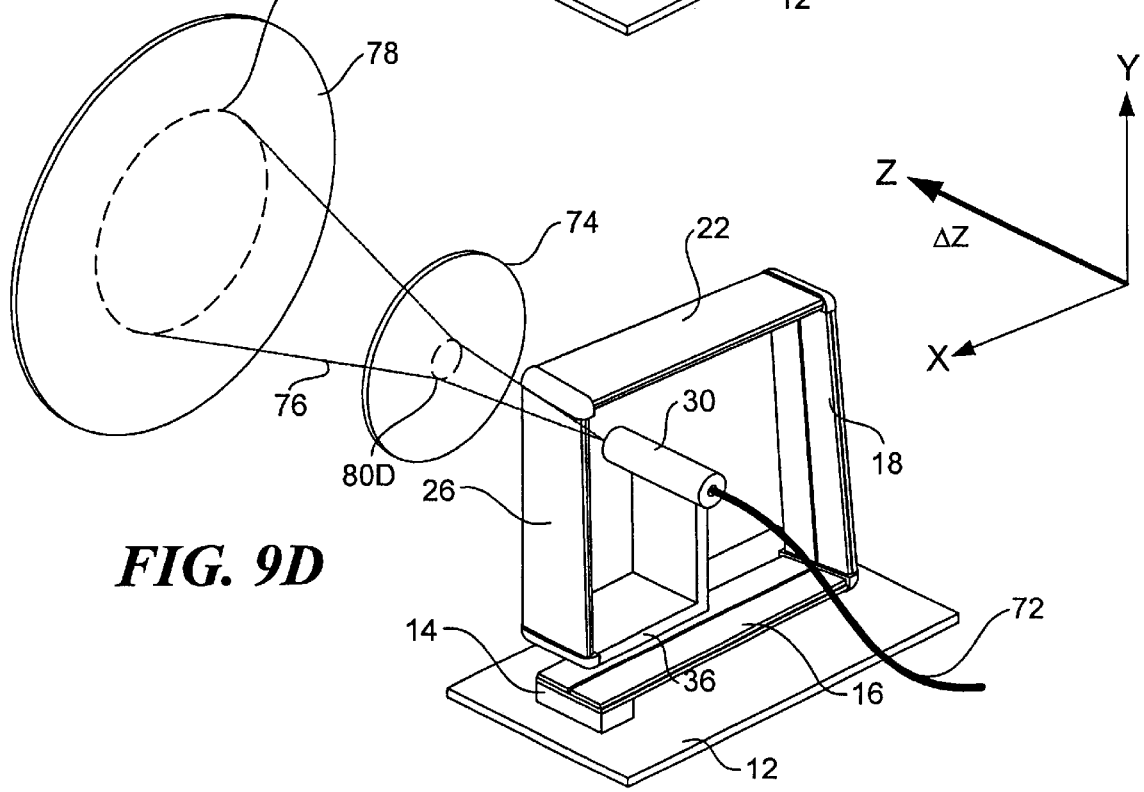

In FIG. 9D, the position of the end effector is shift forward toward collimated lens 74. This results in producing a small circle on the collimated lens, with the result of enlarging the impingement area on primary reflector 78, as depicted by a circle 82D. In general, it will not be as common to move the beam in the +−Z direction after "capture" (the process of initially aligning the collimated beams to enable bidirectional communication between transceivers) has occurred. However, enlarging the size of the beams to assist in the capture operation is a benefit provided by enabling the end effector to shift the end of the fiber optic cables along the Z-axis.

Figure 9E:
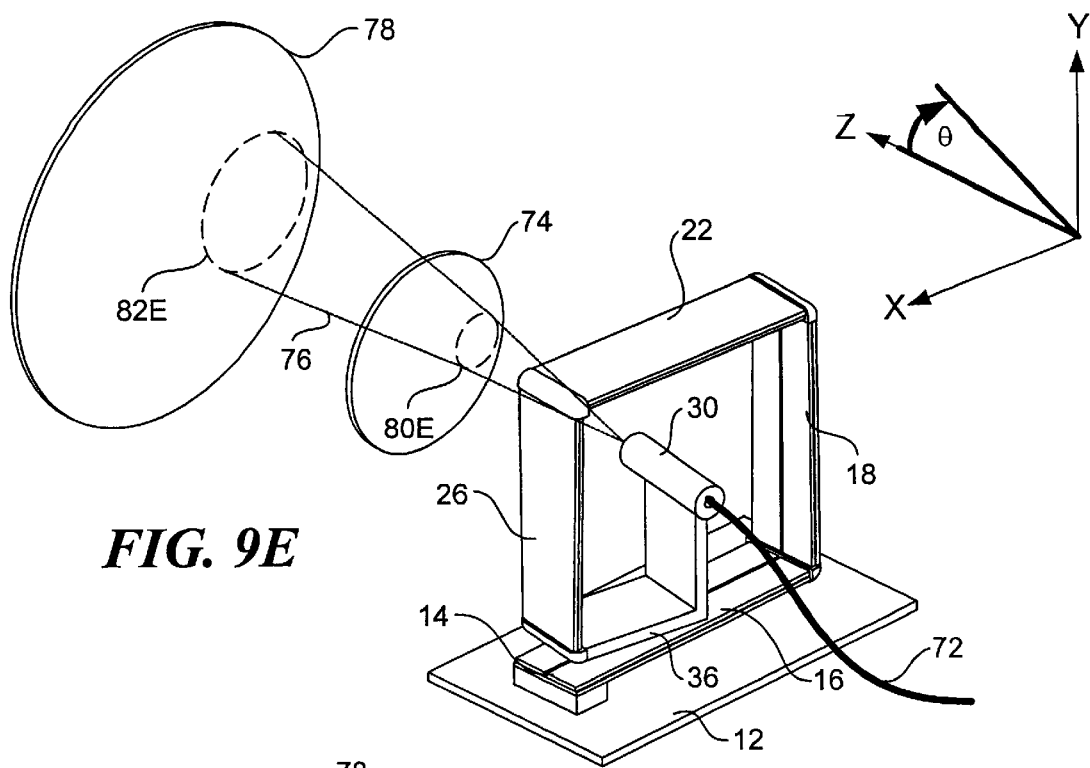
Figure 9F:
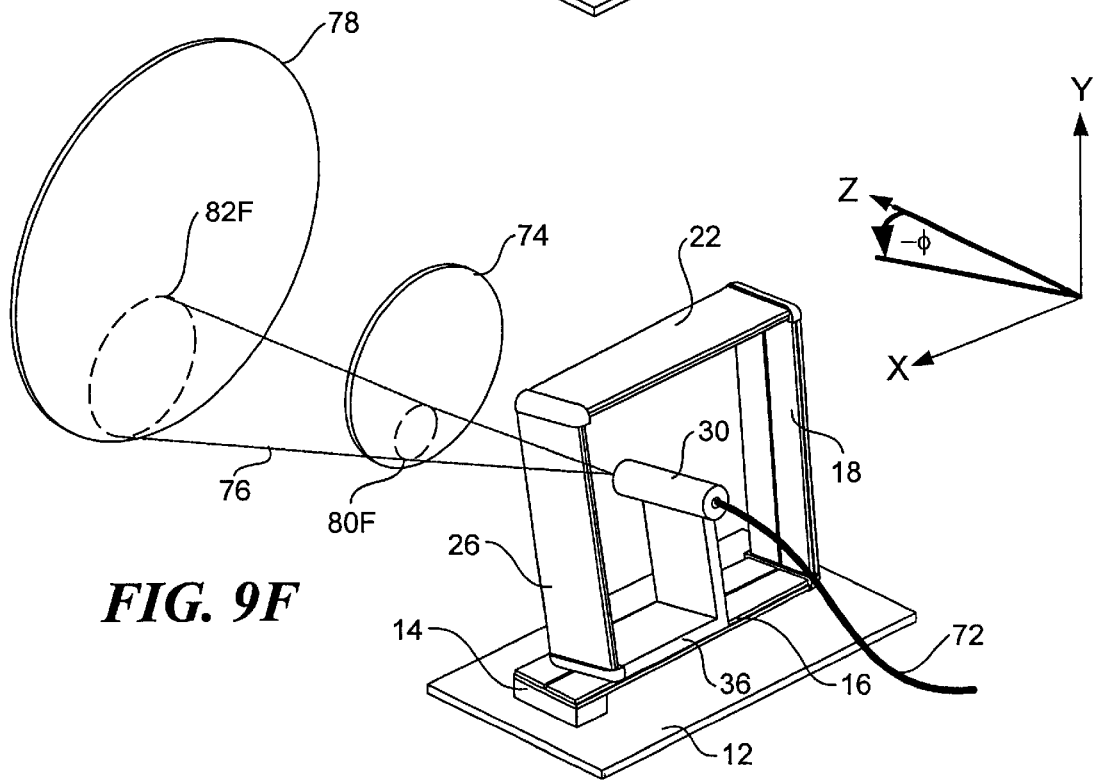

As discussed above, the end effector may be positioned to rotate in a manner that changes the elevation and or azimuth of the beam. An exemplary change in a beam's azimuth, corresponding to a rotation in $\theta$, is depicted in FIG. 9E. An exemplary change in a beam's elevation, corresponding to a rotation in $\phi$, is depicted in FIG. 9F.

Correlative Bimorph Fiber Optic Position Controller

As discussed above, bimorph positioner 10 is suited for implementation in free-space communication systems, wherein it is desired to maintain the optical signal strength at a maximal value. This requires performing error tracking and correction to maintain such signal strength in the event of mechanical disturbances due to, e.g., vibration and building sway.

In order to provide for error tracking and correction, a suitable control system is needed. The control system should provide a high-bandwidth closed loop feedback mechanism that controls the voltage differential applied to the various piezoelectric bimorph elements in the positioner to maintain a maximal signal strength.

Figure 10:
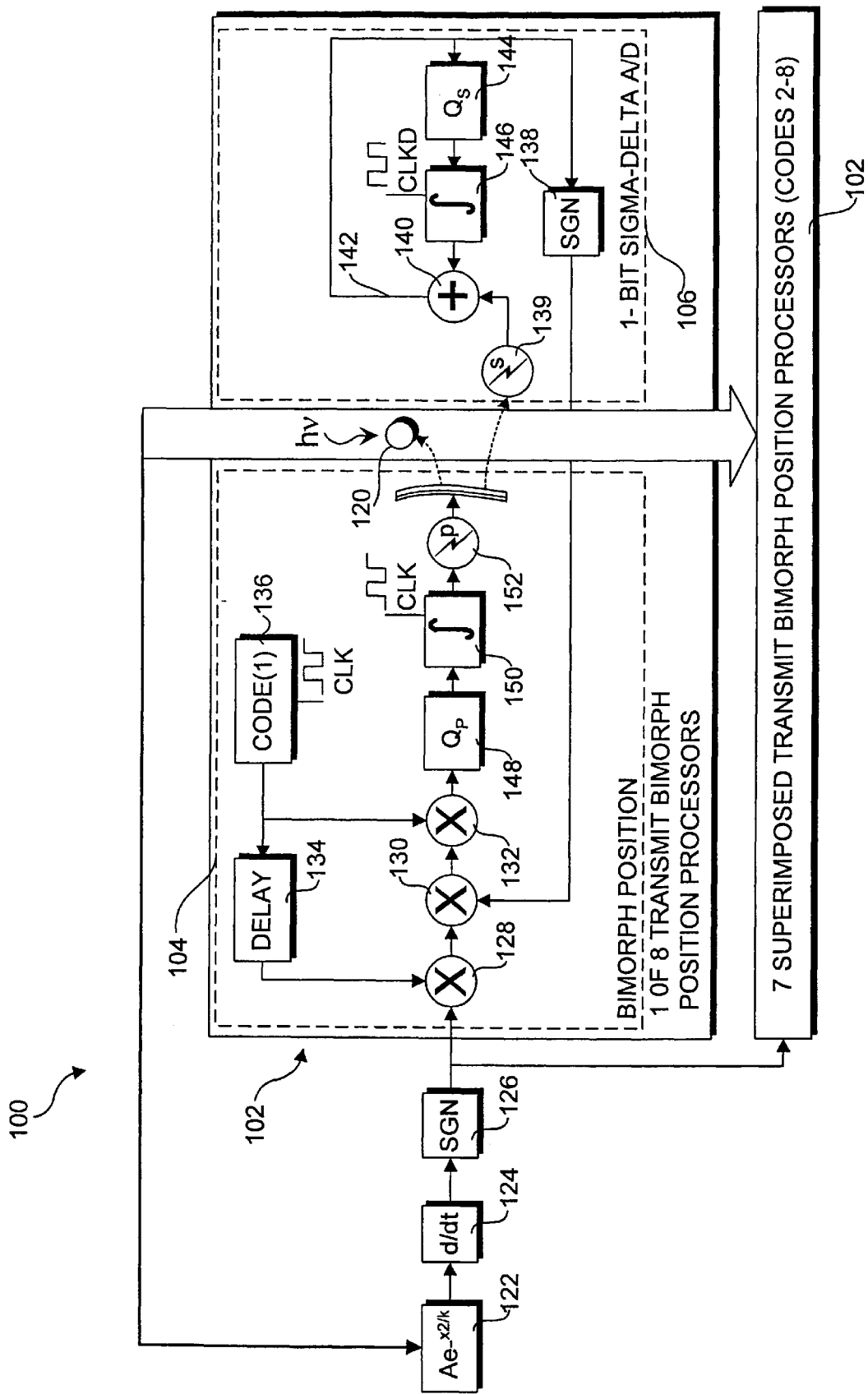
FIG. 10 is a block schematic diagram for an exemplary multi-channel controller that may be used with the bimorph positioner in the free-space optical communication system.

An exemplary correlative multi-channel position controller 100 suitable for use with bimorph positioner 10 is shown in FIG. 10. Position controller 100 includes eight superimposed transmit bimorph position processors 102, which are multiplexed using a code division multiple access CDMA modulation scheme. While details of a single transmit bimorph position processor 102 are depicted in FIG. 10, it will be understood that the other seven transmit bimorph position processors comprise similar structure to that illustrated and described below.

Each transmit bimorph position processor 102 includes a bimorph position block 104 and a one-bit sigma-delta analog-to-digital (A/D) conversion block 106.

With reference to the graph 108 illustrated in FIG. 11, it is desired to maintain the position of an optical beam on a target detector such that the signal is maximized. Under a perfect alignment condition, a maximum signal 110 is obtained. However, due to mechanical disturbances and other anomalies, the direction and/or shape of a transmitted signal will change. In general, the falloff in the signal strength can be modeled with an $Y = Ae^{-X^2/k}$ function, wherein Y is proportional to the optical signal strength hv, and X corresponds to the distance between the center of a transmitted beam as it falls upon a target detector vs. a maximal signal target detector location, as illustrated in FIG. 12 by the $\Delta R$ distance between signals 110 and 112. In addition to signals 110 and 112, other signals depicted in FIGS. 11 and 12 include signals 114, 116, and 118.

Returning to FIG. 10, multi-channel position controller 100 uses an optical signal strength hv measured at a detector 120 as a feedback signal for bimorph position block 104 of each channel, as depicted by an error signal block 122. The error signal block 122 is depicted as a displacement vs. power function $Ae^{-X^2/k}$; however, the value of the signal error will correspond to a difference between a maximal signal and a currently measured signal. As will be understood by those skilled in the control systems art, the maximum value does not need to be known; its mention here is for illustrative purposes. Rather, the objective of the control system is to cause the optical signal to be redirected by tweaking the various drive voltages that are applied to corresponding piezoelectric elements such that the next measured signal strength is higher on the Displacement power function.

Next, a derivative of the error signal, $d(Ae^{-X^2/k})/dt$, is determined in a derivative block 124. The derivative is indicative of both the rate of change and the direction of change. For example, if a first signal strength measured produces a value corresponding to signal 116 and a next signal strength corresponds to a signal 118, the derivative is negative (indicating the signal is getting worse) and the rate of change is equal to the slope of a line 119 that is tangent to both 116 and 118. Similarly, if the first and next signals correspond to signals 114 and 112, respectively, the derivative is positive, with a rate of change equal to the slope of a line 113.

The output of block 124 is then fed into a sign block 126, which produces a single bit output based on the sign of the derivative determined by derivative block 124. For example, if the derivative is positive, the output of sign block 126 is 1, while a negative derivative produces an output of 0.

The sign block output forms the first of two correlative inputs provided by eight channel position controller 100. In this instance, the value output by sign block 126 is indicative of whether the signal strength measured at detector 120 is increasing or decreasing between samples. If the signal strength is increasing, the previous change in the drive voltage input to a current bimorph may have caused this, and so is said to be in the right or properly correlated direction. However, as explained below, an increase in signal strength may occur due to an overall coupling effect, even though the actual drive voltage changes was in the wrong direction. This is the reason for the second correlative input.

The one-bit output of sign block 126 is then fed into the first of three sequential exclusive-or (XOR) multiplier blocks 128, 130, and 132. Each XOR multiplier block multiplies its horizontal input by 1 when one of its inputs is 1 and the other input is 0; otherwise it multiplies its horizontal input by symbolic 0 or value (−1). This mechanism enables multiplexing of the channels through use of CDMA (code division multiple access) codes, whereby a given channel is active only when its corresponding code is currently received by XOR multiplier blocks 128 and 132 via a delay block 134 and a CDMA code block 136, respectively.

CDMA coding is well-known in the art of wireless telecommunication, and is one of two primary mechanisms that enable more digital mobile devices to share the same bandwidth than their analog counterparts (the other being TDMA (time division multiple access). CDMA enables the multiplexing of signals through use of a set of predetermined sequence codes, whereby the number of sequence codes will depend on the number of channels sharing the signal (8 in the present example). In addition, the length of the sequence codes may vary. Preferably, the set of CDMA sequence codes selected will be orthogonal, or substantially orthogonal. By using orthogonal codes, the effects of coupling between channels is substantially eliminated. A common orthogonal code that may be used is the Walsh code, also known as the Walsh-Hadamard code. Orthogonal gold codes may also be used.

In effect, XOR multiplier block 128 functions as a demodulator, while XOR multiplier block 132 functions as a modulator. In order to implement this functionality, the amount of delay should match the amount of time it takes to send a signal from a transmitting transceiver to a receiving transceiver, have that transceiver send a return signal containing signal strength information back to the transmitting transceiver, processing the signals and signal strength information on both ends, and procession the blocks in the loop between XOR multiplier block 132 and XOR multiplier block 128, traversing the loop in a counterclockwise manner.

As depicted in FIG. 10, XOR multiplier block 130 receives its vertical input from a sign block 138 contained within one-bit Sigma-Delta A/D block 106. This value is indicative of whether the previous change in drive voltage for a particular channel caused a corresponding bimorph element to be deformed in the desired direction.

Taken alone, each bimorph element would always (theoretically) move in a direction that corresponded to a change in its drive (differential input) voltage. However, when multiple elongated bimorph members are connected end-to-end in a manner similar to the structure shown in FIG. 1, the motion of the other bimorph members will generally create a coupling effect that impacts the change in position of each individual bimorph member, whereby the coupling effect is superimposed over the deformation effect caused by the change in drive voltage to an individual bimorph member. This coupling effect may be so pronounced that even though a change in drive voltage should cause a given bimorph member to be deformed (e.g., bend) in a certain direction, the superimposed coupling effect may actually cause the bimorph member to be deformed in the opposite direction.

Therefore, it generally may not be possible to determine the behavior of a given bimorph element based on a change in its drive voltage alone. Thus, there needs to be a mechanism for determining the actual direction of the deformation. This is performed by the bimorph members themselves, or more accurately the piezoelectric bimorph elements of the bimorph members. In addition to being deformed in response to a differential drive voltage input, piezoelectric materials also exhibit a sensor effect, producing a voltage in response to a deformation. This effect is used to determine the actual deformation of the bimorph elements, using a timing mechanism whereby a drive voltage is input to each piezoelectric bimorph element for half of a clock cycle, whereupon the drive voltage is removed and the voltage produced due to the deformation of the piezoelectric material in each piezoelectric bimorph element is measured during the second half of a clock cycle. This cycling corresponds to a 50% duty cycle; it is noted that other duty cycles may be used as well.

The determination of the direction the bimorph member is deformed in is made by one-bit sigma-delta block 106, as follows. A sensor voltage signal 139 produced by the piezoelectric bimorph element corresponding to the current channel is fed into a summing block 140, which produces an output 142 that is fed back into feedback loop including a sensor quantizer block 144 and an integration block 146. Quantizer block 144 produces an output signal of +1 volt or −1 volt, depending on the sign of its input signal, which likewise is fed into sign block 138, which produces a 1-bit output (1 or 0) based on the sign of its input voltage. As suggested by the title of the feedback loop block, this functionality of one-bit sigma-delta block 106 may be implemented using a sigma-delta circuit that employs a 1-bit A/D converter.

Returning to the left hand side of the channel control block, based on the output values of sign blocks 126 and 138, delay block 134, and CDMA code block 136, XOR multiplier blocks 128, 130, and 132 collectively produce a logic level output that is fed into a position quantizer block 148, which produces a +1 or −1 volt output based on the logic level of the input signal it receives (e.g., +1 for a logic level 1 input, −1 for a logic level 0 input). The output of position quantizer block 148 is then fed into an integrator 150, which produces an output signal 152 that drives the bimorph element corresponding to the channel.

In order to acquire proper feedback information, it is imperative that the sampling of the piezoelectric sensor and the change in the drive voltage for a given piezoelectric bimorph element does not occur at the same time, but rather is staged, e.g., through use of a duty cycle, as discussed above. Accordingly, in one embodiment, a first clock signal CLK is used to drive the circuitry in bimorph position block 104, while a delayed clock signal CLKD is used to drive the circuitry in one-bit sigma delta block 106.

As discussed above, eight channel position controller 100 includes seven more transmit bimorph position processor blocks 102 that are substantially similar to the block 102 illustrated in FIG. 10, wherein each block 102 corresponds to a respective control channel. Also, the feedback signal from detector 120 is shared by all eight channels, creating a global feedback signal. The piezoelectric sensor feedback signal is independent to each channel, making these feedback signals local signals.

As will be recognized by those skilled in the art, many of the block-level components of multi-channel position controller 100 may be implemented using conventional analog and/or digital blocks, or the entire servo control loop may be implemented digitally using an appropriately programmed digital signal processor (DSP), ASIC (application specific integrated circuit), microcontroller or similar type of processing device.

Figure 13:
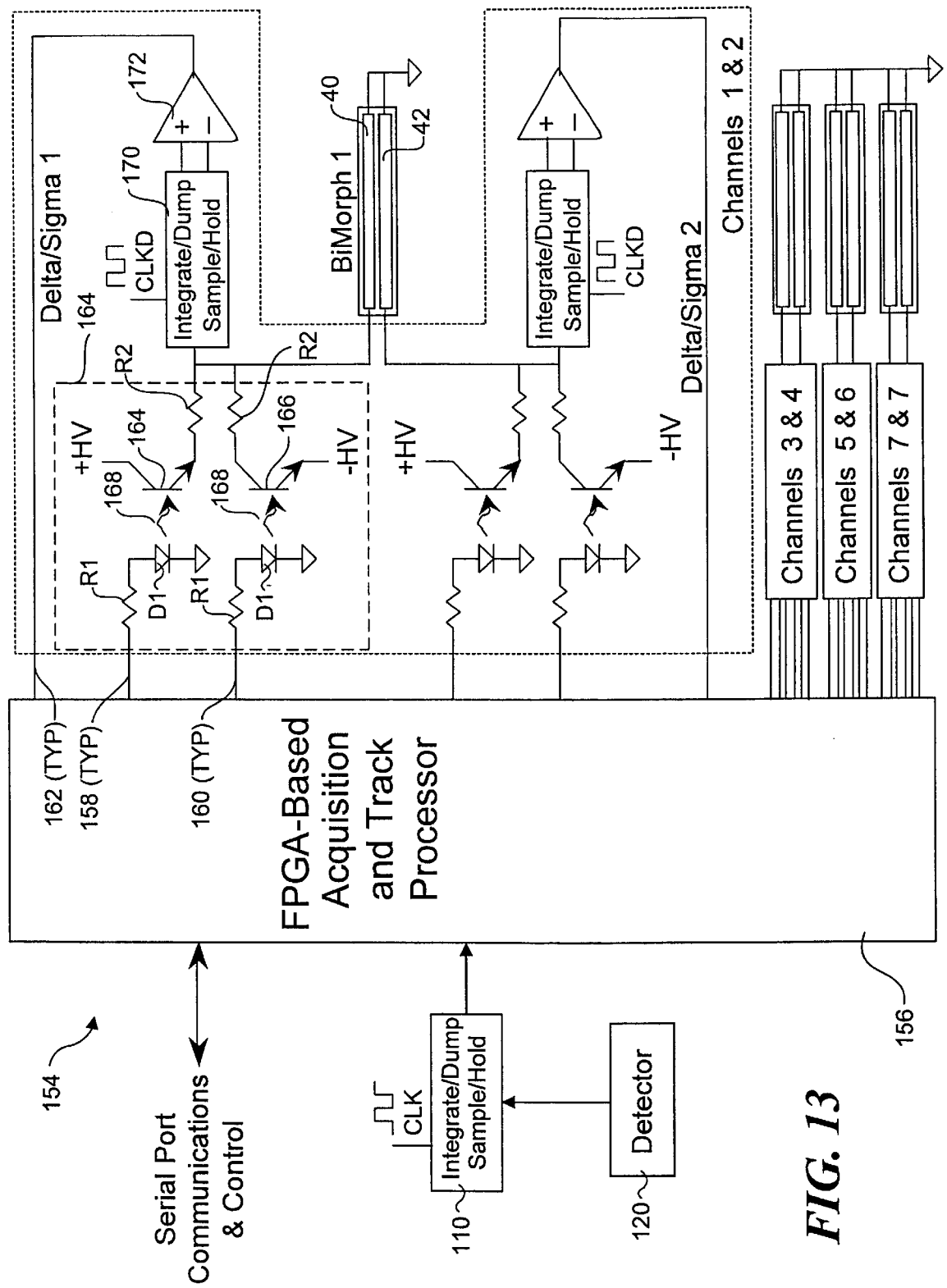
FIG. 13 is a block schematic diagram of an exemplary processing circuit that may be implemented in the multi-channel controller.

For example, an exemplary circuit 154 for implementing multichannel position controller 100 is shown in FIG. 13. The primary logic for circuit 154 is implemented using an FPGA (Field Programmable Gate Array)-based processor 156. Optionally, a microcontroller or microprocessor running suitable software may be used, along with various digital signal processors (DSPs). This includes the logic corresponding to blocks 122, 124, 126, 128, 130, 132, 134, 136, 138, 140, 144, 146, 148, and 152.

FPGA processor 156 produces two output signals 158 and 160 per channel, and receives one sensor feedback signal 162 (i.e., sensor signal 139) per channel. As will be recognized by those skilled in the art, signals 158 and 160 comprise inputs to a class D amplifier 164. When activated, each of signals 158 and 160 passes through a resistor R1 and energizes an LED (light-emitting diode) D1, which switches on respective transistor 164 and 166 via an optical coupling 168. The source of transistor 164 is tied to a positive input voltage +HV, while the drain of transistor 164 is tied to a negative input voltage −HV. The drain of transistor 164 and the source of transistor 166 are commonly tied to the input of an integrate/dump and sample and hold block 170 through respective resistors R2. These lines are also commonly tied to the drive voltage input of piezoelectric bimorph element 40, while the other side of the piezoelectric bimorph element is tied to ground. Similar circuitry applies to channels 2–8.

Each channel operates as follows. Activation of signal 158 switches on transistor 164, which connects +HV (minus the voltage drop across resistor R2) to the drive voltage input of piezoelectric bimorph element 40, causing a portion of a corresponding bimorph member (e.g., base bimorph member 16) in proximity to the element to bend in a first direction. Similarly, activation of signal 160 switches on transistor 164, which connects −HV (minus the voltage drop across resistor R2) to the drive voltage input of piezoelectric bimorph element 40, causing the portion of the bimorph member to bend in the opposite direction. Activation of both signals 158 and 160 forces the drive voltage on the input side to ground, causing the portion of the bimorph member to be returned to a nominal position.

With reference to the timing diagram of FIG. 14, the drive voltage input doesn't produce a step-function response, but rather produces an integrated response as current flows into the input side of the piezoelectric bimorph element. This effect occurs during the first portion of each timing cycle, as indicated by an "integration interval" tag. During a second portion of the timing cycle, both of signals 158 and 160 are deactivated, causing the drain of transistor 164 and the source of transistor 166 to appear as high impedances. As a result, any deformation (e.g., bending) in piezoelectric bimorph element will generate a charge (plus or minus, depending on the direction of bending), which is input into integrate/dump and sample and hold block 170. This charge is then integrated during a sensor settling integral, thereby producing a voltage that is sampled and held. This voltage is than amplified by an amplifier 172, which produces sensor feedback signal 162. At the end (or beginning of each timing cycle), any residual charge in integrate/dump and sample and hold block 170 is dumped, whereupon the cycle is repeated.

Circuit 154 also processes the detector signal produced by detector 120. This signal is passes into an integrate/dump and sample and hold block 174, which integrates the signal, samples and holds the signal, and passes the signal as a voltage to FPGA processor 156 via an input 176.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive. Furthermore, it is not intended that the scope of the invention in any way be limited by the above description, but instead be determined entirely by reference to the claims that follow.

What is claimed is:

1. A bimorph positioning apparatus comprising:
    a plurality of bimorph members connected end-to-end, each bimorph member including at least one piezoelectric bimorph element that causes a portion of the bimorph member in proximity to said at least one piezoelectric bimorph element to deform in response to a drive voltage input to that piezoelectric bimorph element, said plurality of bimorph members including:
        a first bimorph member having a free end and a fixed end coupled to a primary support member upon installation; and
        a last bimorph member, having a first end operatively coupled to the free end of the first bimorph member and a free end;
    an end effector coupled to the free end of the last bimorph member; and
    means for providing electrical input to each of the piezoelectric bimorph members.

2. The bimorph positioning apparatus of claim 1, further comprising:
    at least two intermediate bimorph members connected end-to-end between the first and last bimorph members, including:

a second bimorph member having a first end fixedly coupled to the free end of the first bimorph member and a second end; and a third bimorph member having a first end fixedly coupled to the second end of the second bimorph member and a second end fixedly coupled to a first end of the last bimorph member.

3. The bimorph positioning apparatus of claim 1, wherein each bimorph member has a primary axis in a direction of elongation for that member, and wherein adjacent bimorph members are coupled such that their respective primary axes are substantially orthogonal.

4. The bimorph positioning apparatus of claim 1, wherein the means for providing electrical input to said plurality of elongated bimorph members comprises a flex-circuit.

5. The bimorph positioning apparatus of claim 1, wherein said at least one piezoelectric bimorph element on at least one of said plurality of bimorph members comprises two separated sections, each having separate electrical inputs such that application of different drive voltages to said separate electrical inputs causes said at least one bimorph member to twist.

6. The bimorph positioning apparatus of claim 5, wherein at least four substantially identical bimorph members are connected end-to-end, and the end effector of the bimorph positioner can be caused to be displaced about 5 degrees of freedom, including linear displacements along orthogonal X, Y, and Z axes, and rotational displacements in elevation and azimuth axes.

7. The bimorph positioning apparatus of claim 1, wherein at least one of said plurality of bimorph members comprises a five-layer sandwich assembly including:

first outside metallic layer;

a middle metallic layer;

a first piezoelectric material layer disposed between the first outside metallic layer and the middle metallic layer;

a second outside metallic layer; and a second piezoelectric material layer disposed between the middle and the second outside metallic layers.

8. The bimorph positioning apparatus of claim 7, wherein the middle metallic layer is split lengthwise into two sections, such that separate portions of the bimorph member proximate to those sections may be caused to be deformed independently through separate drive voltage inputs to the two sections.

9. The bimorph positioning apparatus of claim 1, further comprising a multi-channel controller, one channel for each piezoelectric bimorph element, which controls a position of the end effector by providing independent drive voltages to each of the piezoelectric bimorph elements.

10. The bimorph positioning apparatus of claim 9, wherein the multi-channel controller provides a correlative functionality based on a global feedback signal that is shared by all of the channels and a local feedback signal for each channel that is not shared by any other channels.

11. The bimorph positioning apparatus of claim 10, wherein the global feedback signal is related to a position of the end effector and each channel's local feedback signal is a function of a position of that channel's corresponding piezoelectric bimorph element.

12. The bimorph positioning apparatus of claim 11, wherein the position of a given piezoelectric bimorph element is determined by integrating a charge produced by that piezoelectric bimorph element caused by a deformation of that element.

13. The bimorph positioning apparatus of claim 9, wherein the channels of the multi-channel controller are superimposed on one another and control signals received and processed by each channel are kept substantially separated through use of a CDMA (code division data multiple access) modulation scheme.

14. The bimorph positioning apparatus of claim 10, wherein the positioning apparatus is used in a free-space optical communication system comprising a first and second transceiver, and the global feedback signal is a function of an optical signal strength of an optical signal that is produced from an end of a fiber optic cable coupled to an end effector of a bimorph positioner in the first transceiver as measured by a optical signal detecting component in the second transceiver.

15. A free-space optical communication system comprising first and second transceivers that transmit data to one another via collimated optical signals, wherein each transceiver comprises:

a primary receiving optical component;

an optical signal detector;

a multiple-degree of freedom bimorph positioning apparatus including:

a plurality of bimorph members connected end-to-end, each bimorph member including at least one piezoelectric bimorph element that causes a portion of the bimorph member in proximity to said at least one piezoelectric bimorph element to deform in response to a drive voltage input to that piezoelectric bimorph element, said plurality of bimorph members including:

a first bimorph member having a free end and a fixed end coupled to a primary support member upon installation; and a last bimorph member, having a first end operatively coupled to the free end of the first bimorph member and a free end; and an end effector coupled to the free end of the last bimorph member; and an optical fiber cable having an end portion coupled to the end effector and being capable of being supplied with an energy input that causes an optical signal to be emitted from the end portion of the optical fiber cable; and a controller that controls an orientation of the end portion of the fiber optic cable via the end effector such that the optical signal transmitted by the transceiver is directed toward the primary receiving optical component of the other transceiver in a manner that produces a substantially maximized optical signal strength over time as measured by the optical signal detector of the other transceiver.

16. The free-space optical system of claim 15, wherein each bimorph positioning apparatus further comprises:

at least two intermediate bimorph members connected end-to-end between the first and last bimorph members, including:

a second bimorph member having a first end fixedly coupled to the free end of the first bimorph member and a second end; and a third bimorph member having a first end fixedly coupled to the second end of the second bimorph member and a second end fixedly coupled to a first end of the last bimorph member.

17. The free-space optical system of claim 15, wherein said at least one piezoelectric bimorph element on at least one of said plurality of bimorph members comprises two separated sections, each having separate electrical inputs such that application of different drive voltages to said separate electrical inputs causes said at least one bimorph member to twist.

18. The free-space optical system of claim 17, wherein at least four substantially identical bimorph members are connected end-to-end for each bimorph positioning apparatus, and the end effector of each bimorph positioning apparatus can be caused to be displaced about 5 degrees of freedom, including linear displacements along orthogonal X, Y, and Z axes, and rotational displacements in elevation and azimuth axes.

19. The free-space optical system of claim 15, wherein the controller comprises a multi-channel controller, one channel for each piezoelectric bimorph element, which controls the position of the end effector by providing independent drive voltages to each of the piezoelectric bimorph elements.

20. The free-space optical system of claim 19, wherein the multi-channel controller provides a correlative functionality based on a global feedback signal corresponding to an optical signal strength measured by a receiving transceiver that is shared by all of the channels and a local feedback signal for each channel that is a function of a position of that channel's corresponding piezoelectric bimorph element.

21. The free-space optical system of claim 20, wherein the position of a given piezoelectric bimorph element is determined by integrating a charge produced by that piezoelectric bimorph element caused by a deformation of that element.

22. The free-space optical system of claim 19, wherein the channels of the multi-channel controller are superimposed on one another and control signals received and processed by each channel are kept substantially separated through use of a CDMA (code division data multiple access) modulation scheme.

* * * * *